US007928405B2

(12) United States Patent
Adamec et al.

(10) Patent No.: US 7,928,405 B2
(45) Date of Patent: Apr. 19, 2011

(54) MAGNETIC LENS ASSEMBLY

(75) Inventors: Pavel Adamec, Haar (DE); Carlo Salvesen, Massing (DE); Ivo Liska, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 303 days.

(21) Appl. No.: 12/181,199

(22) Filed: Jul. 28, 2008

(65) Prior Publication Data
US 2009/0039280 A1 Feb. 12, 2009

(30) Foreign Application Priority Data

Jul. 27, 2007 (EP) .................................... 07014812

(51) Int. Cl.
*H01J 1/50* (2006.01)
(52) U.S. Cl. ................ 250/396 ML; 250/310; 250/397; 250/398; 250/491.1
(58) Field of Classification Search ........... 250/396 ML, 250/397, 398, 310, 491.1
See application file for complete search history.

(56) References Cited

U.S. PATENT DOCUMENTS

| | | | | |
|---|---|---|---|---|
| 4,039,810 A * | 8/1977 | Heritage | ................ | 250/396 ML |
| 4,096,386 A | 6/1978 | Rempfer et al. | | |
| 4,219,732 A * | 8/1980 | Nakagawa et al. | .... | 250/396 ML |
| 4,384,208 A * | 5/1983 | Tsuno | .................... | 250/396 ML |
| 4,419,581 A * | 12/1983 | Nakagawa | ............. | 250/396 ML |
| 4,468,563 A * | 8/1984 | Tsuno et al. | ........... | 250/396 ML |
| 4,585,942 A * | 4/1986 | Tsuno | .................... | 250/396 ML |
| 4,779,046 A * | 10/1988 | Rouberoi et al. | ............. | 324/751 |
| 4,806,766 A * | 2/1989 | Chisholm | .............. | 250/396 ML |
| 4,806,767 A * | 2/1989 | Kubozoe et al. | ........ | 250/396 ML |
| 4,823,006 A * | 4/1989 | Danilatos et al. | ............. | 250/310 |
| 5,729,022 A * | 3/1998 | Veneklasen et al. | ... | 250/396 ML |
| 5,780,859 A * | 7/1998 | Feuerbaum et al. | ...... | 250/396 R |
| 6,002,135 A * | 12/1999 | Veneklasen et al. | ... | 250/396 ML |
| 6,130,432 A * | 10/2000 | Pfeiffer et al. | ......... | 250/396 ML |
| 6,362,486 B1 * | 3/2002 | Into | ........................ | 250/396 ML |
| 6,555,815 B2 * | 4/2003 | Feuerbaum et al. | ............. | 850/14 |
| 6,897,450 B2 * | 5/2005 | Yonezawa | ................. | 250/396 R |
| 6,924,494 B2 * | 8/2005 | Veneklasen et al. | ..... | 250/492.22 |

(Continued)

FOREIGN PATENT DOCUMENTS

DE 19845329 A1 9/1999
(Continued)

OTHER PUBLICATIONS

Extended European Search Report, European Patent Application No. 07014813.5, Applicant: ICT Integrated Circuit Testing Gesellschaft für Halbleiterprüftechnik mbH, Jan. 14, 2008.
(Continued)

*Primary Examiner* — David A Vanore
(74) *Attorney, Agent, or Firm* — Patterson & Sheridan, L.L.P.

(57) ABSTRACT

A lens assembly having a magnetic lens assembly for a charged particle beam system is provided. The lens assembly includes: a first pole piece having a connecting portion of the first pole piece and a gap portion of the first pole piece, a second pole piece having a connecting portion of the second pole piece and a gap portion of the second pole piece, wherein the first pole piece and the second pole piece provide a gap at the respective gap portions, a coil for exciting the magnetic lens assembly, a centering element comprising a material that has a smaller Young's modulus than the material of the first and the material of the second pole piece, wherein the pole pieces are connected with each other at the respective connecting portions and have a centering element receiving portion towards the respective gap portion ends of the pole pieces.

20 Claims, 3 Drawing Sheets

U.S. PATENT DOCUMENTS

| | | | |
|---|---|---|---|
| 6,949,745 B2* | 9/2005 | Yonezawa | 250/311 |
| 7,247,848 B2* | 7/2007 | Nakasuji et al. | 250/306 |
| 7,307,260 B2* | 12/2007 | Choi et al. | 250/396 R |
| 7,420,164 B2* | 9/2008 | Nakasuji et al. | 250/307 |
| 7,759,652 B2* | 7/2010 | Ohshima et al. | 250/396 ML |
| 2002/0148961 A1* | 10/2002 | Nakasuji et al. | 250/311 |
| 2003/0098415 A1* | 5/2003 | Matsuya et al. | 250/306 |
| 2005/0263712 A1* | 12/2005 | Choi et al. | 250/396 R |
| 2005/0263715 A1* | 12/2005 | Nakasuji et al. | 250/396 ML |
| 2007/0075257 A1 | 4/2007 | Kametani et al. | |
| 2008/0121810 A1* | 5/2008 | Liu et al. | 250/396 ML |
| 2009/0026384 A1* | 1/2009 | Adamec et al. | 250/396 R |
| 2009/0039280 A1* | 2/2009 | Adamec et al. | 250/396 ML |

FOREIGN PATENT DOCUMENTS

| | | |
|---|---|---|
| EP | 0352085 A | 1/1990 |
| EP | 01605492 A1 | 12/2005 |
| JP | 60-095843 A1 | 5/1985 |
| JP | 02-181350 A1 | 7/1990 |
| JP | 05-082062 A | 4/1993 |

OTHER PUBLICATIONS

Extended European Search Report, European Patent Application No. 07014812.7, Applicant: ICT Integrated Circuit Testing Gesellschaft für Halbleiterprüftechnik mbH, Jan. 16, 2008.

* cited by examiner

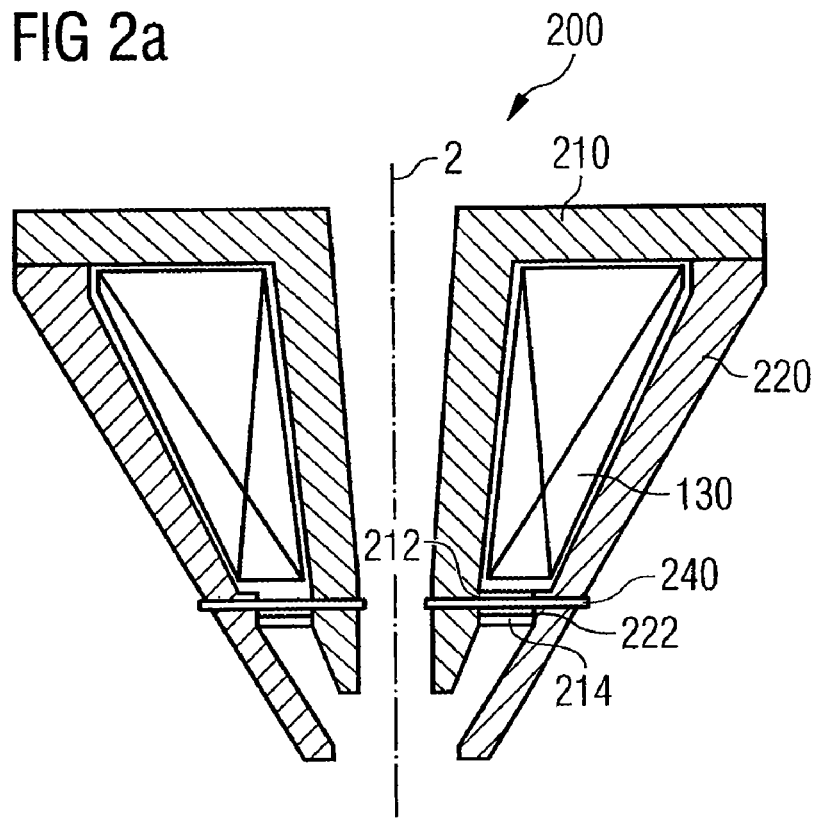
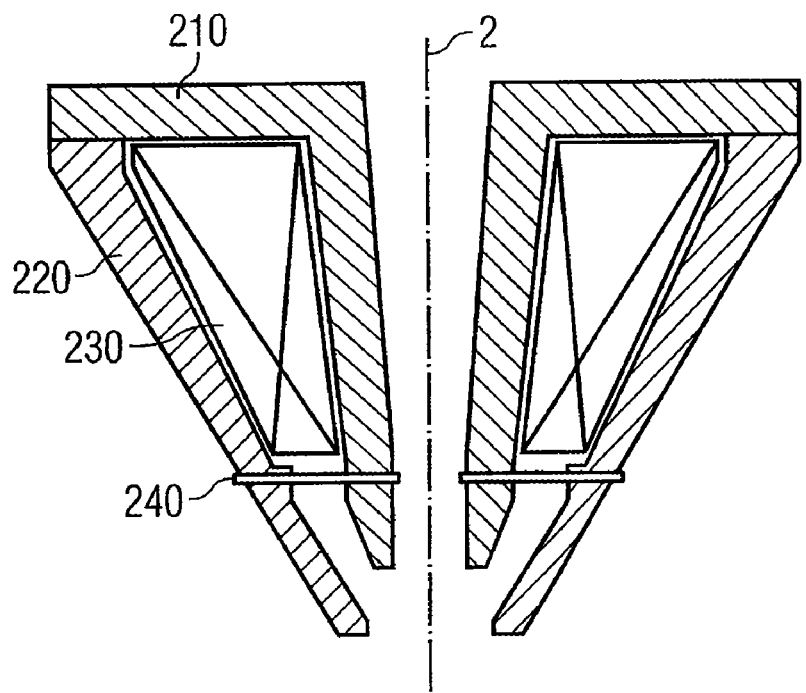

MAGNETIC LENS ASSEMBLY

FIELD OF THE INVENTION

The invention generally relates to a charged particle beam device and a method of manufacturing components of a charged particle beam device, particularly for inspection applications, testing applications, lithography applications and the like. Specifically, it relates to a lens assembly for a charged particle beam device, a charge particle beam device with a lens assembly and a method for manufacturing a lens assembly for a charged particle beam device.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams, due to their short wavelengths.

The resolution of charged particle beam devices depends inter alia on the charged particle beam optics. One charged particle beam optical element, which is often used in charged particle beam devices, is a magnetic lens or a combined magnetic-electrostatic lens. Generally, a magnetic lens or a magnetic lens component includes two pole pieces, which are energized by an excitation coil. In order to achieve high quality and, thereby, good imaging properties the pole pieces of the lens need to be precisely manufactured and precisely aligned with respect to each other. In particular, a conically shaped objective lens, which is often used as an objective lens being a scanning charged particle beam device, can be difficult to manufacture and to align.

SUMMARY OF THE INVENTION

In light of the above, the present invention intends to provide an improved charged particle beam device, an improved method of operating a charged particle beam device, and a method of manufacturing the charged particle device.

According to one embodiment, a lens assembly having a magnetic lens assembly for a charged particle beam system is provided. The lens assembly includes: a first pole piece having a connecting portion of the first pole piece and a gap portion of the first pole piece, a second pole piece having a connecting portion of the second pole piece and a gap portion of the second pole piece, wherein the first pole piece and the second pole piece provide a gap at the respective gap portions, a coil for exciting the magnetic lens assembly, a centering element comprising a material that has a smaller Young's modulus than the material of the first and the material of the second pole piece, wherein the pole pieces are connected with each other at the respective connecting portions and each have a respective centering element receiving portion.

According to another embodiment, a charged particle beam device is provided. The charged particle beam device includes: a lens assembly. The lens assembly includes: a first pole piece having a connecting portion of the first pole piece and a gap portion of the first pole piece, a second pole piece having a connecting portion of the second pole piece and a gap portion of the second pole piece, wherein the first pole piece and the second pole piece provide a gap at the respective gap portions, a coil for exciting the magnetic lens assembly, a centering element comprising a material that has a smaller Young's modulus than the material of the first and the material of the second pole piece, wherein the pole pieces are connected with each other at the respective connecting portions and each have a respective centering element receiving portion.

According to a further embodiment, a method of manufacturing a lens assembly having a magnetic lens assembly for a charged particle beam system is provided. The method includes: providing a first pole piece, a second pole piece and a coil, and aligning the first pole piece and the second pole piece with a ring-shaped centering element comprising a material that has a smaller Young's modulus than the material of the first and the material of the second pole piece.

Further advantages, features, aspects and details that can be combined with the above embodiments are evident from the dependent claims, the description and the drawings.

Embodiments are also directed to apparatuses for carrying out the disclosed methods and including apparatus parts for performing each described method steps. These method steps may be performed by way of hardware components, a computer programmed by appropriate software, by any combination of the two or in any other manner. Furthermore, embodiments are also directed to methods by which the described apparatus operates. It includes method steps for carrying out every function of the apparatus or manufacturing every part of the apparatus.

BRIEF DESCRIPTION OF THE DRAWINGS

Some of the above indicated and other more detailed aspects of the invention will be described in the following description and partially illustrated with reference to the figures. Therein:

FIGS. 2*a* and 2*b* show schematic views of another lens assembly including pole pieces, an excitation coil, an alignment ring and fixing means according to the embodiments described herein.

DETAILED DESCRIPTION OF THE DRAWINGS

Without limiting the scope of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image or to pattern a specimen.

Within the following description of the drawings, the same reference numbers refer to the same components. Generally, only the differences with respect to the individual embodiments are described.

Figure 1:
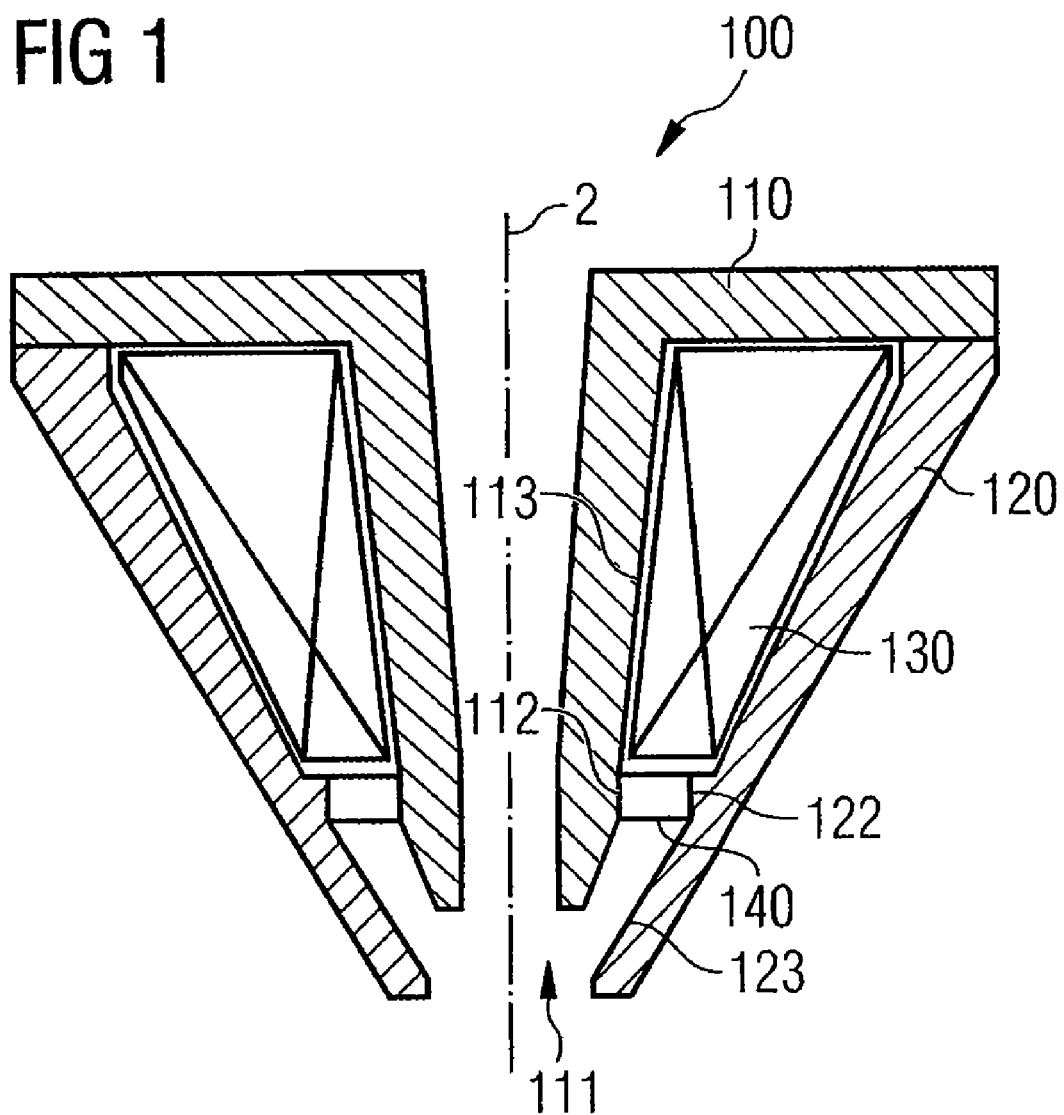
FIG. 1 shows a schematic view of the lens assembly including pole pieces, a coil, and a centering ring according to embodiments described herein.

Within FIG. 1 the lens assembly 100 is shown. The lens assembly includes a magnetic lens assembly, which is axially symmetric with respect to the optical axis 2. A first pole piece 110 and a second pole piece 120 are provided. Typically, the pole pieces are rotationally symmetric. The magnetic lens assembly can be excited by excitation coil 130, which is provided within the space defined by a first pole piece 110 and the second pole piece 120.

In order to be able to further improve the resolution of a charged particle beam device, it is desired to provide the dimensions and the alignment of the pole pieces with accuracy in the micrometer range. According to one embodiment, the accuracy of the pole pieces, particularly in the gap region, are within the range of 1 µm, typically in a range of 1 µm to 10 µm.

Each of the pole pieces, that is, the first pole piece 110 and second pole piece 120 have an upper portion and a lower portion. Within FIG. 1 a gap 111 is provided at a lower portion of the pole pieces. The magnetic field generated by the excitation coil 130 is guided through the pole pieces and charged particles trespassing through the lens assembly 100 and are focused by the magnetic field in the gap region of the lens.

Within FIG. 1, the gap 111 is provided at the lower portion of the lens assembly and, thus, at the lower portion of the first pole piece 110 and at the lower portion of the second pole piece 120. The first pole piece and the second pole piece are connected at the upper portion at their respective upper portions. It is understood that gap 111 could, according to a further embodiment, also be provided at the upper portion of the lens assembly 100. Associated therewith, the first pole piece and the second pole piece would then be connected at their respective lower portions. According to an even further embodiment, the gap 111 can also be provided at a center position. A connection between the first pole piece and second pole piece would then be provided at the opposing ends of the pole pieces, respectively.

Generally, according to embodiments described herein, the first pole piece and the second pole piece have a connecting portion, for example an upper portion in FIG. 1, and have a gap portion, for example a lower portion in FIG. 1. The connecting portion of each of the pole pieces is the portion at which the pole pieces are connected to each other. The gap portion provides the gap between the pole pieces after assembling or connecting the pole pieces with each other. As shown in FIG. 1, an alignment or centering element 140, e.g. a ring, is provided between the pole pieces. The centering element is positioned at a respective centering element receiving portion of the first pole piece and the second pole piece. Thereby, it is according to one embodiment possible, that the centering element receiving portion is positioned closer to the gap portion of the pole pieces than to the connecting portions of the pole pieces. That is, the centering element receiving portion is positioned towards the gap portion of the pole pieces.

Within FIG. 1 a conically shaped lens assembly 100 is shown. According to one embodiment, this type of lens is typically used as an objective lens in scanning charged particle beam devices. Therein, the gap 111 is typically provided at the lower portion of the lens assembly.

It is to be understood that the term conical or conically is defined herein as a rotational symmetric body with a rotational axis, the body having a first diameter in one plane at a first axis position and a second, larger diameter in a plane at a second axis position. Thereby, typically at least a portion of the conically shaped body includes a portion of a cone.

When the first pole piece 110 and the second pole piece 120 are pre-manufactured and connected to each other, they need to be aligned in order to provide the desired accuracy. The materials of the first pole piece and the second pole piece, which may according to one embodiment be the same material, are typically magnetically soft materials. These materials are sensitive to stress. Therefore, an alignment which does not introduce stress to the first pole piece and/or the second pole piece is desirable.

Within FIG. 1, a centering element 140 is provided. Thereby, according to one embodiment, the centering element is provided between the first pole piece and second pole piece with, e.g., a plastic material. According to one embodiment, the material of the centering element is a soft and/or elastic material. According to another embodiment, the centering element can typically be in a ring-shaped form.

According to the embodiments described herein, ring-shaped is to be understood as a body being rotationally symmetric with respect to the axis of the lens assembly 100. This can, according to one embodiment, be a hollow cylinder shaped as a ring. According to further embodiments, other protrusions or recesses may be formed within the centering element, wherein the individual contour portions of the element are circular or rotationally symmetric.

According to one embodiment, as shown in FIG. 1, the centering element 140 is provided between a centering element receiving portion 112 of the first pole piece 110 and a centering element receiving portion 122 of the second pole piece 120. According to another embodiment, the centering element receiving portion 112 is adjacent to a conical portion 113 of the first pole piece. Thereby, the movement of the centering ring 114 along the upward direction of axis 2 can be prevented. Further, the centering element receiving portion 122 is adjacent to a conical portion 123 of the second pole piece 120. Thereby the movement of the centering ring 140 along the downward direction of axis 2 can be prevented. Thus, the centering ring 114 is securely positioned in the lens assembly 100.

Within the embodiments described herein, the material of the centering element, e.g., made of plastic, is softer than the materials used for the first pole piece and/or the second pole piece. Thus, the material of the centering element has a smaller hardness that is a smaller resistance to permanent and, in particular, plastic deformation. Thereby, the centering element is adapted to reduce tension in the first pole piece 110 and the second pole piece 120 when the lens assembly is manufactured. According to one embodiment, a hardness and/or the Young's modulus of the centering ring 140 is at least a factor 10 or typically a factor 50 lower than a hardness and/or Young's modulus of the material of the pole pieces.

According to further embodiments described herein, the material of the centering ring 140 is elastic. According to one embodiment, the Young's modulus of the centering ring 114 is in the range of 1 GPa to 20 GPa.

Typical embodiments described herein may include any of the following materials for the centering ring 140. The centering element can include Polyetheretherketones (PEEK). Typically a Young's Modulus of PEEK is about 3700 MPa. According to another embodiment, the centering element can include Polyoxymethylene (acetal) (POM) having, for example, a Young's modulus of 2.8 to 3.7 GPa. According to an even further embodiment, the centering ring can include a Polyamide. Polyamides have a Young's modulus in the range of 2.3 GPa. For example, Nylon has a Young's modulus of 2400 MPa. Other materials, that might according to further embodiments additionally or alternatively be used, are polyimide, PET, epoxide (e.g., epoxy-resin), polypropylene, PVC or the like.

In light of the above, it is possible to press-fit the centering ring 140 between the first pole piece 110 and the second pole piece 120. As a result, the tolerance of the lens assembly can be minimized during manufacturing. Further, tension, which is created during the pressing of the lens assembly components to each other, is absorbed by the material of the centering element 140, and can, thus, be reduced.

Therefore, it is possible to manufacture the centering element 114 with an outer diameter that is identical or even slightly (for example 1/50 mm or 1/100 mm) larger than the inner diameter of the centering element receiving portion of the outer pole piece. The inner diameter of the centering element can be manufactured to be identical or slightly (for example, 1/50 mm or 1/100 mm) smaller than the outer diameter of the centering element receiving portion of the inner pole piece. Since the centering element absorbs the tension that might be introduced during press-fitting the centering element in the lens assembly, tension is reduced for the sensitive pole pieces.

FIGS. 2a and 2b show another example of a lens assembly 200. Therein, pole pieces 210 and 220 are provided. Excitation coil 130 is adapted to excite the magnetic lens assembly of the lens assembly. Contrary to the embodiments described with respect to FIG. 1, the outer pole piece and the inner pole piece include openings to receive fixing members 214. According to one embodiment, fixing members 214 can be screws, bolts, pins or other elements that fix the relative position of the first pole piece 210 and the second pole piece 220.

Thereby it is according to one embodiment possible that the openings for receiving the fixing members are generated in the first and second pole piece after the first and the second pole piece have been aligned with each other. This can improve the accuracy of the assembly of the magnetic lens component.

According to one embodiment, the openings for receiving the fixing elements are provided at least three circumferential positions along the centering element receiving portion 212 and the centering receiving portion 222, respectively.

After the fixing element 240 is inserted to securely position the first pole piece and the second pole piece with respect to each other, the centering element 214 can be removed. This is for example shown in FIG. 2b. As described above, the material of the centering element is softer than the materials used for the first pole piece and/or the second pole piece. The material of the centering element has a smaller hardness that is a smaller resistance to permanent, and in particular plastic deformation. Thereby, the centering element is adapted to reduce tension in the first pole piece 110 and the second pole piece 120 when the lens assembly is manufactured. According to one embodiment, a hardness and/or the Young's modulus of the centering ring 140 is at least a factor 10 or typically a factor 50 lower than a hardness and/or Young's modulus of the material of the pole pieces.

According to further embodiments described herein, the material of the centering ring 140 is elastic. According to one embodiment, the Young's modulus of the centering ring 114 is in the range of 1 GPa to 20 GPa.

Typical embodiments described herein, may use PEEK, POM, or Polyamide as materials included in the centering element. Thereby, a Young's modulus between 1 GPa and 4 GPa can, for example, be realized. Other materials, that might according to further embodiments additionally or alternatively be used, are polyimide, PET, epoxide (e.g., epoxy-resin), polypropylene, PVC or the like.

In light of the above, it is possible to press-fit the centering ring 140 between the first pole piece 110 and the second pole piece 120. As a result, the tolerance of the lens assembly can be minimized during manufacturing. Further, tension, which is created during the pressing of the lens assembly components to each other, is absorbed by the material of the centering element 140.

According to even further embodiments, a magnetic lens assembly of a compound magnetic-electrostatic lens can also be manufactured with a centering element including a material that has a smaller hardness and/or Young's modulus than the materials of the pole pieces. Accordingly, for a compound lens a first pole piece and a second pole piece can be aligned with respect to each other by using any of the embodiments of a centering element described herein. According to one embodiment, the compound lens is provided to include the centering ring as described. According to another embodiment, the compound lens is manufactured with a centering ring as described above and the centering ring is removed after assembly of the components of the lens.

Figure 3:
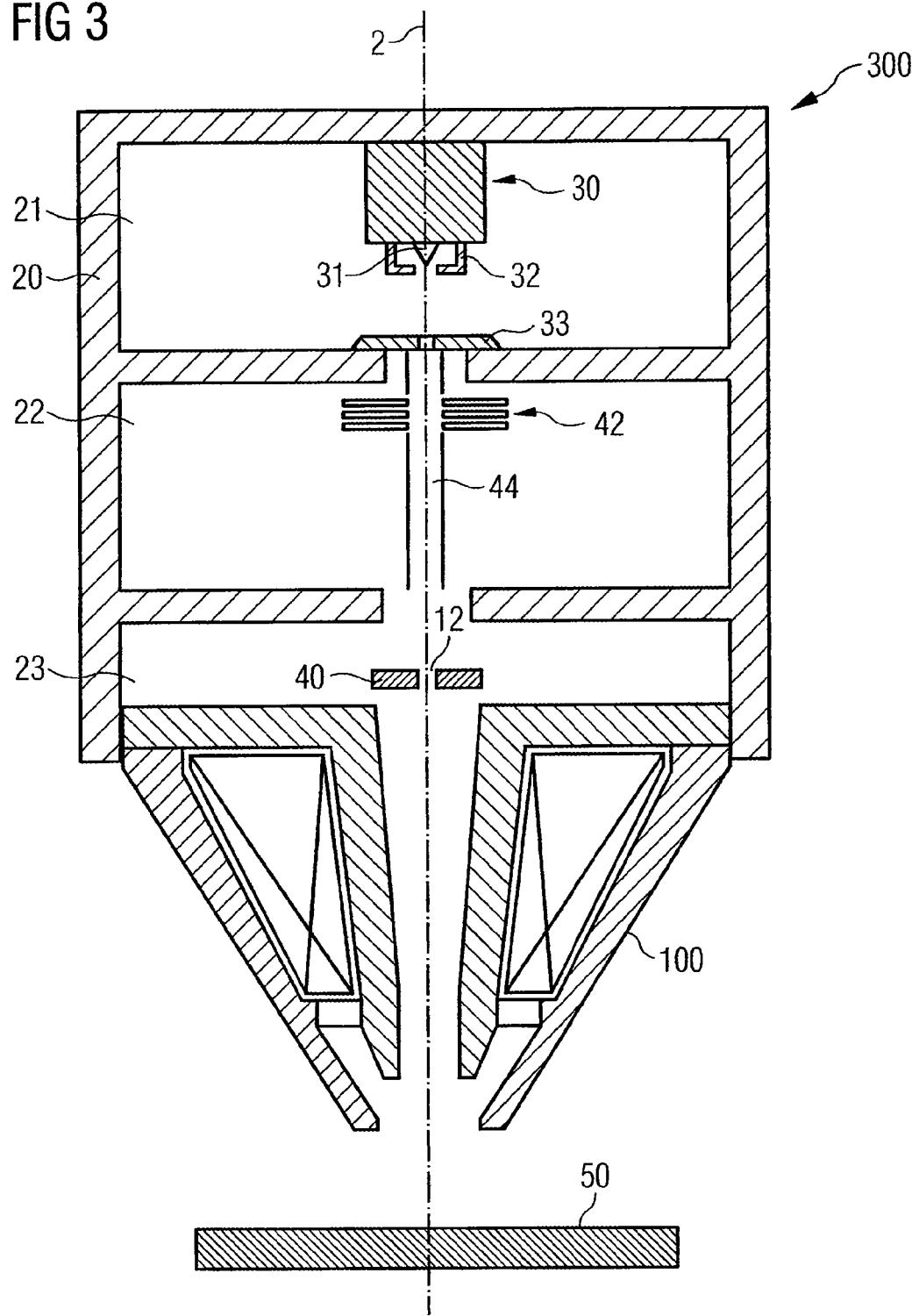
FIG. 3 shows a charged particle beam device including a lens assembly according to embodiments described herein.

Within FIG. 3, a charged particle beam device 300 is shown. Electron beam device can be a scanning electron beam microscope. Electron gun 30 includes an emitter 31 and suppressor 32. The primary beam is emitted essentially along optical axis 2. The gun chamber housing is separated by aperture 33 from the following chamber. The aperture 33 can also act as an anode. The primary electron beam is formed and guided by condenser lens 42 and beam guiding tubes 44. The primary electron beam passes through the opening 12 in detector 40 and is focused by objective lens 100. The specimen 50 is provided below the objective lens. Within the embodiment of FIG. 3, lenses can be provided according to any of the embodiments described herein. For example, objective lens 100 can be provided as described with respect to FIG. 1.

As described above, embodiments of lens assemblies described herein include a first pole piece and a second pole piece and a centering ring of a material with a smaller hardness and/or Young's modulus for aligning the first and the second pole pieces. The soft material properties of the centering ring can minimize tensions that might be introduced in the pole pieces during manufacturing. Thereby, an easy and accurate manufacturing of the lens assembly can be provided.

The assemblies and manufacturing and methods according to embodiments described herein allow higher accuracy of the positioning of the elements of the magnetic lens component to be achieved with a less complicated manufacturing process.

According to further embodiments, the centering element can be in a ring-shaped form, can be elastic, and/or can be press-fitted between the centering element receiving portion of the first pole piece and the centering element receiving portion of the second pole piece.

According to yet further embodiments, the centering element comprises at least one material selected from the group consisting of: POM, Polyamide and PEEK, can be elastic, and/or have a Young's modulus of 1 GPa to 20 GPa or of 2 GPa to 4 GPa. Other materials, that might according to further embodiments additionally or alternatively be used, are polyimide, PET, epoxide (e.g., epoxy-resin), polypropylene, PVC or the like.

According to even further embodiments, the arrangement of pole pieces and centering ring can also be used in compound lenses and within charged particle beam devices, wherein the lens assembly can typically be an objective lens.

According to one embodiment of a method of manufacturing a lens assembly, a centering element as described with respect to any of the embodiments herein can be used to align a first and a second pole piece of a lens assembly. According to a further embodiment, the centering element is ring-shaped and can be fitted by pressing the ring-shaped centering element between the pole pieces. According to yet further embodiments, manufacturing includes: fixing the relative position of the first pole piece and the second pole piece; and removing the centering element.

While the foregoing is directed to embodiments of the invention, other and further embodiments of the invention may be devised without departing from the basic scope thereof, and the scope thereof is determined by the claims that follow.

The invention claimed is:

1. Lens assembly having a magnetic lens assembly for a charged particle beam system, comprising:
   a first pole piece having a connecting portion of the first pole piece and a gap portion of the first pole piece;
   a second pole piece having a connecting portion of the second pole piece and a gap portion of the second pole piece, wherein the first pole piece and the second pole piece provide a gap at the respective gap portions;
   a coil for exciting the magnetic lens assembly;
   a centering element comprising a material that has a smaller Young's modulus than the material of the first and the material of the second pole piece;
   wherein the pole pieces are in contact with each other at the respective connecting portions and each have a respective centering element receiving portion.

2. Lens assembly according to claim 1, wherein the centering element is a ring-shaped centering element.

3. Lens assembly according to claim 1, wherein the centering element receiving portions of the first and second pole piece is positioned towards the respective gap portions.

4. Lens assembly according to claim 1, wherein the centering element comprises a plastic material.

5. Lens assembly according to claim 1, wherein the centering element is elastic.

6. Lens assembly according to claim 1, wherein the centering element is press-fitted between the centering element receiving portion of the first pole piece and the centering element receiving portion of the second pole piece.

7. Lens assembly according to claim 1, wherein the centering element comprises at least one material selected from the group consisting of: POM, Polyamide, PEEK, polyimide, PET, epoxide, polypropylene, PVC and combinations thereof.

8. Lens assembly according to claim 1, wherein the centering element has a Young's modulus of 1 GPa to 20 GPa.

9. Lens assembly according to claim 8, wherein the centering element has a Young's modulus of 2 GPa to 4 GPa.

10. Lens assembly according to claim 1, wherein the centering element is pressed by about 1/100 mm for press-fitting between the first pole piece and the second pole piece.

11. Lens assembly according to claim 1, wherein the centering element has an outer diameter that is about 1/100 mm larger than an inner diameter of a corresponding centering element receiving portion and an inner diameter that is about 1/100 mm smaller than an outer diameter of a corresponding centering element receiving portion.

12. Lens assembly according to claim 1, further comprising:
   an electrostatic lens assembly such that the magnetic lens assembly and the electrostatic lens assembly form a compound magnetic electrostatic lens.

13. Lens assembly according to claim 1, wherein the lens assembly includes a conically shaped portion.

14. Charged particle beam device, comprising:
   a lens assembly having a magnetic lens assembly for a charged particle beam system, the lens assembly comprising:
      a first pole piece having a connecting portion of the first pole piece and a gap portion of the first pole piece;
      a second pole piece having a connecting portion of the second pole piece and a gap portion of the second pole piece, wherein the first pole piece and the second pole piece provide a gap at the respective gap portions;
      a coil for exciting the magnetic lens assembly;
      a centering element comprising a material that has a smaller Young's modulus than the material of the first and the material of the second pole piece;
      wherein the pole pieces are in contact with each other at the respective connecting portions and each have a respective centering element receiving portion.

15. Charged particle beam device according to claim 14, wherein the lens assembly is an objective lens in the charged particle beam device.

16. Method of manufacturing a lens assembly having a magnetic lens assembly for a charged particle beam system, comprising:
   providing a first pole piece, a second pole piece, and a coil, the first and second pole pieces each having a respective connecting portion in contact with each other; and
   aligning the first pole piece and the second pole piece with a ring-shaped centering element at respective centering element receiving portions of the first and the second pole piece, the centering element comprising a material that has a smaller Young's modulus than the material of the first and the material of the second pole piece.

17. Method of manufacturing a lens assembly according to claim 16, wherein the first pole piece and the second pole piece are aligned by fitting the ring-shaped centering element between the first pole piece and the second pole piece.

18. Method of manufacturing a lens assembly according to claim 16, wherein the ring-shaped centering element is fitted by press-fitting the ring-shaped centering element.

19. Method of manufacturing a lens assembly according to claim 16, further comprising:
   fixing the relative position of the first pole piece and the second pole piece; and
   removing the centering element.

20. Method of manufacturing a lens assembly according to claim 19, wherein the fixing includes manufacturing of fixing element openings in the pole pieces after aligning the pole pieces with respect to each other.

* * * * *